United States Patent
Abiko et al.

(10) Patent No.: US 6,281,094 B1
(45) Date of Patent: *Aug. 28, 2001

(54) METHOD OF FABRICATING SEMICONDUCTOR DEVICE CAPABLE OF PROVIDING MOSFET WHICH IS IMPROVED IN A THRESHOLD VOLTAGE THEREOF

(75) Inventors: Hitoshi Abiko; Minoru Higuchi, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/082,186

(22) Filed: May 21, 1998

(30) Foreign Application Priority Data

May 21, 1997 (JP) .................................................. 9-131296

(51) Int. Cl.[7] .................................................. H01L 21/331
(52) U.S. Cl. .......................................... 438/433; 257/338
(58) Field of Search ............................ 438/221–224, 438/228–231, 232–247, 248–249, 252–303, 305, 306, 433; 257/338

(56) References Cited

U.S. PATENT DOCUMENTS

| 4,534,824 | 8/1985 | Chen ..................... 156/628 |
| 4,653,177 | * 3/1987 | Lebowitz et al. ............ 438/433 |
| 4,656,730 | * 4/1987 | Lynch et al. ............... 438/433 |
| 4,683,645 | * 8/1987 | Naguib et al. .............. 438/297 |
| 4,766,090 | * 8/1988 | Coquin et al. .............. 438/433 |
| 4,861,729 | * 8/1989 | Fuse et al. ................ 438/433 |
| 4,918,027 | 4/1990 | Fuse et al. ................. 437/35 |
| 5,395,781 | * 3/1995 | Wilholt .................... 438/303 |
| 5,668,044 | * 9/1997 | Ohno ....................... 438/433 |
| 5,674,775 | * 10/1997 | Ho et al. .................. 438/296 |

FOREIGN PATENT DOCUMENTS

| 0 399 066 A1 | 11/1990 | (EP) . |
| 0 731 494 A2 | 9/1996 | (EP) . |
| 0 731 494 A2 | 11/1996 | (EP) . |
| 0 731 494 A3 | 11/1996 | (EP) . |
| 59032125 | 2/1984 | (JP) . |
| 4-274321 | 9/1992 | (JP) . |
| 6-177239 | 6/1994 | (JP) . |
| 87/00687 | 1/1987 | (WO) . |
| WO 87/00687 | 1/1987 | (WO) . |

OTHER PUBLICATIONS

Stanley Wolf Silicon Processing for the VSLI Era vol. III Lattice Press pp. 222–226, 1995.*
Stanley Wolf Silicon Processing for the VSLI Era vol. 1 Lattice Press p. 25, 1986.*
Stanley Wolf Silicon Processing for the VSLI Era vol. II Lattice Press pp. 430–431, 1990.*
Stanley Wolf Silicon Processing for the VSLI Era vol. III Latice Press pp. 623–629, 1995.*
T. Izuka et al., Double Threshold MOSFETS in Bird's–Beak Free Structures, IEDM Technical Digest, pp. 380–383, (1981).

* cited by examiner

Primary Examiner—Charles Bowers
Assistant Examiner—David S Blum
(74) Attorney, Agent, or Firm—Foley & Lardner

(57) ABSTRACT

In a method of fabricating a semiconductor device by the use of a semiconductor substrate (1), boron ions (4) are implanted into the semiconductor substrate from a trench (3) which is formed to the semiconductor substrate. The trench is defined by a plurality of side surfaces and a bottom surface extending between the side surfaces. The boron ions are implanted through all of the side surfaces and the bottom surface. It is preferable that isolating material is filled into the trench to produce a trench isolation extending over a p-well (7) and a n-well (8).

11 Claims, 5 Drawing Sheets

METHOD OF FABRICATING SEMICONDUCTOR DEVICE CAPABLE OF PROVIDING MOSFET WHICH IS IMPROVED IN A THRESHOLD VOLTAGE THEREOF

BACKGROUND OF THE INVENTION

1. Field of the Invention

The present invention relates to a method of fabricating a semiconductor device provided with a trench isolation, particularly to a method of fabricating a semiconductor device capable of reducing an inverse narrow channel effect in which a threshold voltage lowers as the channel width of a transistor decreases in a metal oxide semiconductor field effect transistor (MOSFET).

2. Description of the Related Art

Referring to FIG. 1A, description will be made about a conventional method of fabricating a semiconductor device. A trench 103 is first formed on a single-crystal silicon substrate 101, then the inner surfaces of the trench 103 are entirely oxidized through the chemical vapor deposition (CVD) method, and silicon oxide 105 is piled up as shown in FIG. 1A.

Then, as shown in FIG. 1B, the silicon oxide 105 on the surface is polished and smoothed through the chemical mechanical polishing (CMP) method and thereby, the trench 103 is filled with the silicon oxide 105, and then the surface of the silicon oxide 105 and the principal surface of the single-crystal silicon substrate 101 are covered with a gate insulating film 111 to be formed between the silicon oxide 105 and a gate electrode 110.

In this case, when the silicon oxide 105 filling the bottom of the trench 103 is lower than the principal surface of the single-crystal silicon substrate 101 as shown in FIG. 1B, a problem occurs that the threshold voltage of a MOSFET lowers by approx. 0.15 V if the channel width of the MOSFET decreases to 0.2 $\mu$m from 10 $\mu$m as shown by the characteristic diagram in FIG. 1C.

This is because, as described, for example, in IEDM (International Electron Devices Meeting) in 1981, Technical Digest (pp. 380–383), an electric field V in the internal direction of the single-crystal silicon substrate 101 from the gate electrode 110 and an electric field H in the direction parallel with the surface are concentrated nearby a trench shoulder 112 and then the threshold voltage of the trench shoulder 112 lowers.

That is, when the channel width of a MOSFET decreases, the rate of the portion where the threshold voltage lowers to the entire channel increases and the threshold voltage of the entire MOSFET also lowers.

To solve the above problem, there is a method of raising the threshold voltage of an edge portion of the semiconductor device by implanting impurity ions from the side surfaces of a trench.

However, because the impurity concentration becomes higher than that in the single-crystal silicon substrate 101 in the vicinity of the interface between the single-crystal silicon substrate 101 and an oxide film filling the trench 103, a junction capacity and a junction leak current are increased.

To avoid the above problem, as described in Japanese Unexamined Patent Publication No. 6-177239 (177239/1998) for example, there is a method of forming a tapered trench by etching a separation region of the semiconductor device, that is, a method of controlling the concentration of electric fields by preventing a shoulder shape from being formed at an edge portion of a semiconductor device or chamfering a shoulder.

In the case of the above conventional method of fabricating a semiconductor device, there is a problem that a phenomenon due to the inverse narrow channel effect occurs in which a threshold voltage lowers when the channel width of a transistor is too small even if using the method of controlling the concentration of electric fields by preventing a shoulder shape from being formed at an edge portion of the semiconductor device or chamfering a shoulder.

This is because the boron contained in a channel is piled up on the silicon oxide side filling a trench at the interface between the silicon of a substrate and the silicon oxide due to thermal diffusion and thereby, it diffuses outward, and a region in which the boron concentration lowers is formed nearby the interface between the trench and the substrate. The boron diffusion occurs even at approx. 800° C. because inter-grid silicon is present which is produced due to ion implantation or the like.

Moreover, because phosphorus or arsenic serving as an impurity for forming an n-well is piled up on the silicon side of a substrate, it does not diffuse outward from a channel. Therefore, the above phenomenon does not occur.

SUMMARY OF THE INVENTION

It is an object of the present invention to provide a semiconductor device fabrication method in which a threshold voltage does not lower even if the channel width of a transistor decreases.

Other objects of the present invention will become clear as the description proceeds.

A method to which the present invention is applicable is of fabricating a semiconductor device including a p-well, an n-well, and a trench isolation extending over the p-well and said n-well. The method comprises the steps of preparing a semiconductor substrate and forming a trench for the trench isolation to the semiconductor substrate. The trench is defined by a plurality of side surfaces and a bottom surface extending between said side surfaces. The method further comprises implanting boron ions into the semiconductor substrate through the side surfaces and the bottom surface.

DESCRIPTION OF THE PREFERRED EMBODIMENTS

Then, an embodiment of the present invention is described below by referring to the accompanying drawings.

Figure 2A:
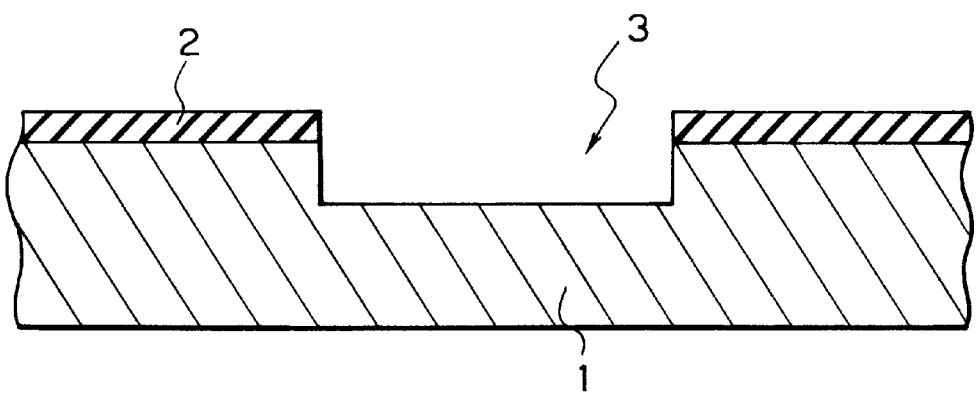
FIGS. 2A to 2C are sectional views for explaining an embodiment of the present invention.
Figure 2B:
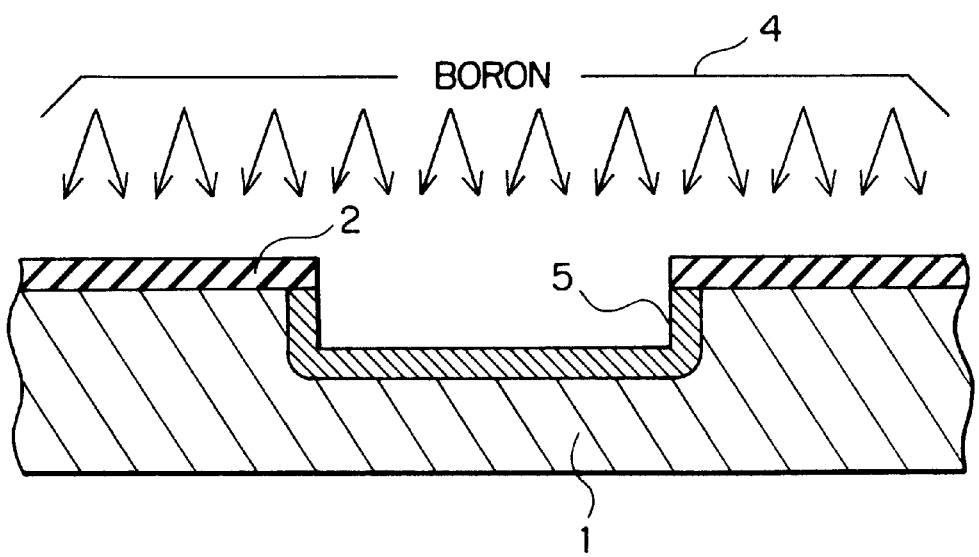
Figure 2C:
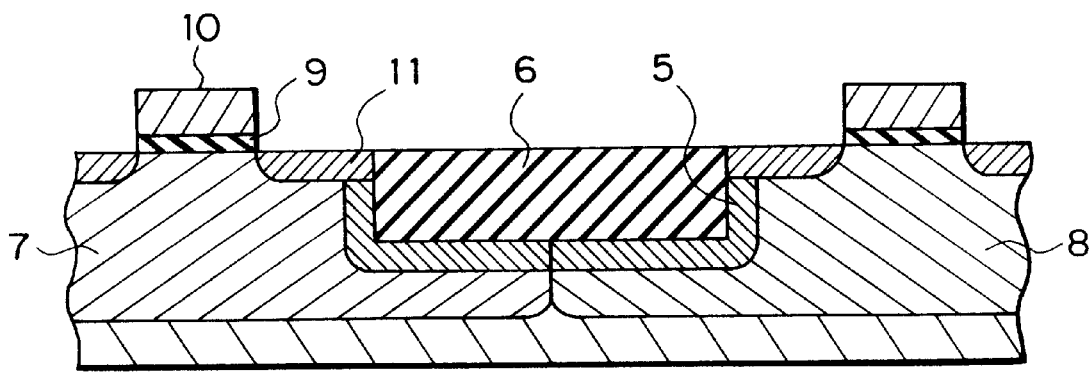

FIGS. 2A to 2C are sectional views showing an embodiment of the present invention. In the case of the semiconductor fabrication method shown in FIG. 2A to 2C, a trench 3 is formed after the step of forming silicon oxide 2 on the principal surface of a first-conducting-type single-crystal silicon substrate 1 as shown in FIG. 2A. The trench 3 has a plurality of side surfaces and a bottom surface extending between the side surfaces.

In the next step, as shown in FIG. 2B, ions of boron 4 are implanted on the entire surfaces of the trench 3 including its wall surfaces in the diagonal direction by using the silicon oxide 2 as a mask. For example, ions of the boron 4 are implanted at a dose rate of 5E 12 cm$^{-2}$ into the side wall of the trench 3. By the ion implantation, a boron implanted layer 5 is formed. In the case of an implantation depth, it is necessary that the peak of an impurity distribution is present at a position of approx. 50 nm from the surface. For example, it is necessary that approx. 30 KeV can be applied when tilting an implantation angle by 30° from the vertical direction.

The above condition does not restrict the present invention. Conditions can be changed in accordance with a case in which a different implantation angle is used or a mask of silicon oxide is formed on the surfaces of a trench.

Then, as shown in FIG. 2C, the trench 3 is filled with isolating material of silicon oxide 6 to produce the trench isolation described before. The principal surface of the substrate 1 in a range excepting the silicon oxide 6 is exposed by the step of surface polishing, and impurity ions for respectively forming a p-well 7 and an n-well 8 are implanted to form source-drain 11 through annealing. Boron is accelerated and diffused by the inter-grid silicon produced in the above steps, mainly in the ion implantation step and the concentration lowers. However, because only the boron corresponding to the quantity first implanted into the entire surface outward diffuses into a silicon oxide 6 filling the trench 3, the boron concentration of the p-well 7 does not lower to a predetermined concentration or less nearby the interface between the single-crystal silicon substrate 1 and the trench 3. Therefore, the inverse narrow channel effect does not occur.

FIG. 2C further shows a state of completing the step of forming a gate insulating film 9 and a gate electrode 10.

Figure 3:
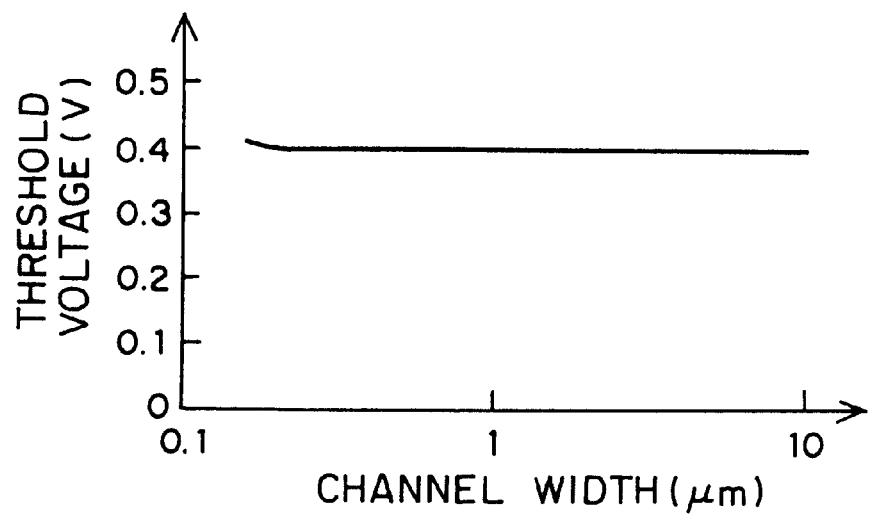
FIG. 3 is a characteristic diagram showing an example of the channel width dependency of the threshold voltage in FIG. 2.

Moreover, FIG. 3 is a characteristic diagram showing the channel-width dependency of a MOSFET threshold voltage in accordance with the step described by referring to FIGS. 2A to 2C. As shown in FIG. 3, threshold voltages hardly change even if channel widths change.

Figure 4:
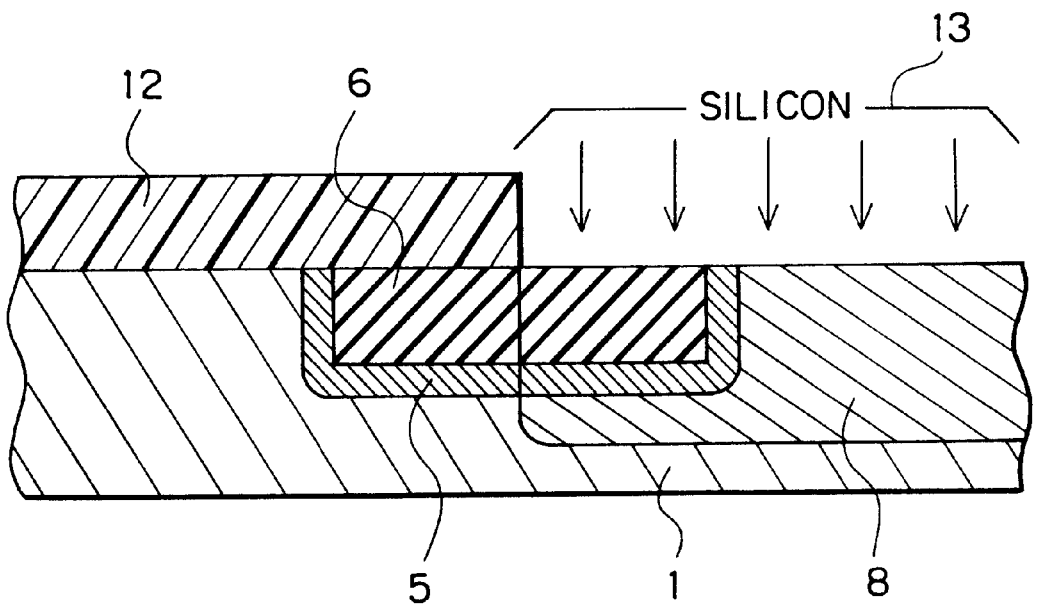
FIG. 4 is a sectional view showing the second embodiment of the present invention.

Then, the second embodiment different from the embodiment shown in FIGS. 2A to 2C is described below by referring to FIG. 4.

In FIG. 2C, it is preferable to outward diffuse the boron in the region for the n-well 8 in the direction of the silicon oxide 6 in the trench. Therefore, as shown in FIG. 4, when implanting ions into the n-well 8, it is necessary to increase the amount of inter-grid silicon by using photoresist 12 as a mask and thereby additionally implanting silicon 13. In this case, a dose rate of 1E 14 cm$^{-2}$ or more is preferable.

Figure 5:
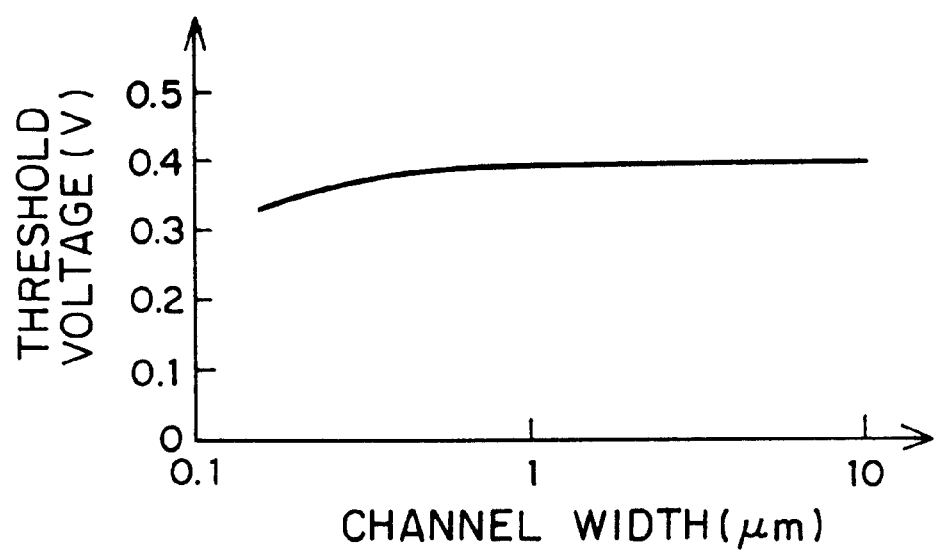
FIG. 5 is a characteristic diagram showing an example of the channel width dependency of the threshold voltage in the third embodiment of the present invention.

Then, the third embodiment having the characteristic in FIG. 5 is described below.

Figure 1A:
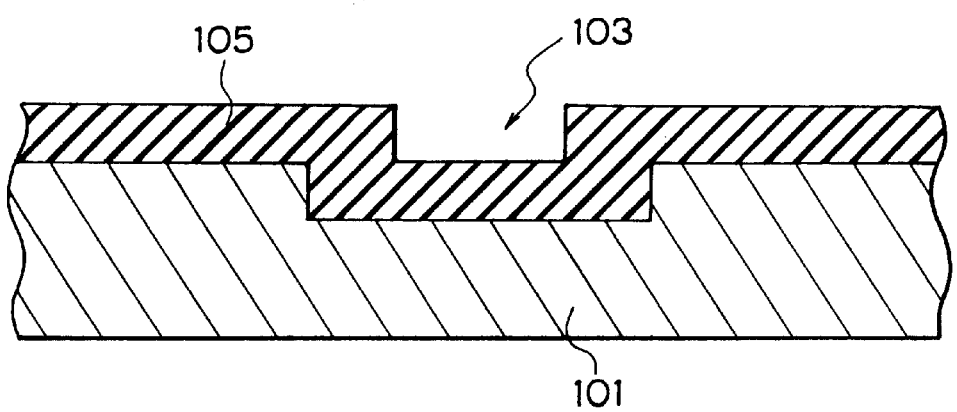
FIGS. 1A and 1B are sectional views showing a conventional example.
Figure 1B:
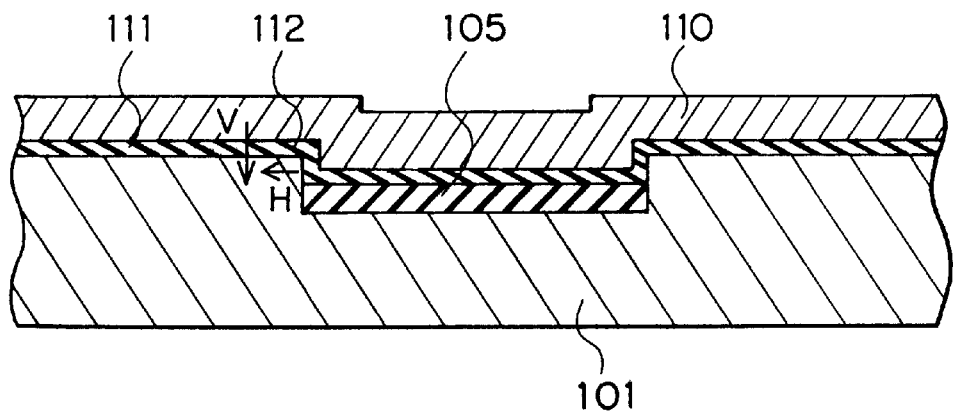
Figure 1C:
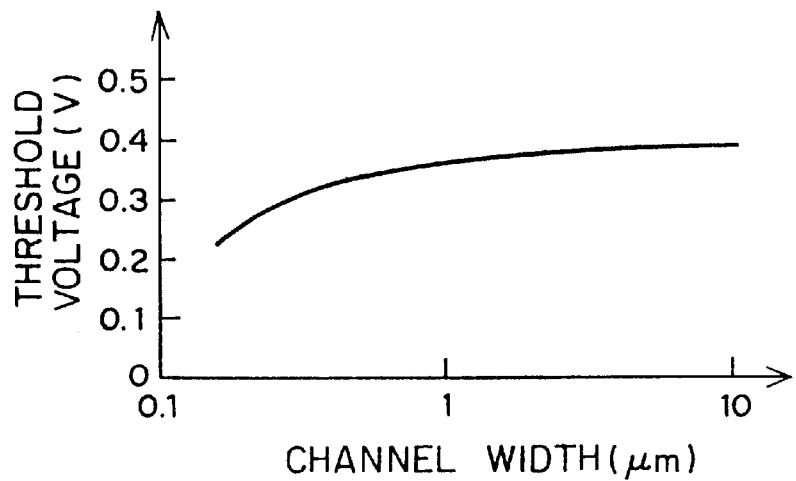
FIG. 1C is a characteristic diagram showing an example of the channel width dependency of a threshold voltage.

FIG. 5 is a characteristic diagram in which phosphorus ions are additionally implanted when implanting boron ions into the entire surface shown in FIG. 2B. Phosphorus ions are implanted at the energy realizing a depth almost equal to the case of boron ions and at a dose rate equal to or up to two times larger than that of boron. In the case of this method, the inverse narrow channel effect remains. However, even if the channel width decreases from 10 μm to 0.2 μm, the threshold voltage decreases only by approx. 0.08 V and a great improvement of the characteristic is confirmed compared to the conventional characteristic shown in FIG. 1C.

This advantage is also obtained by using arsenic instead of phosphorus. Moreover, the same advantage can be also obtained by combining phosphorus with arsenic. Even if these elements are implanted before or after the boron implantation step, the improved advantage is the same.

Figure 6:
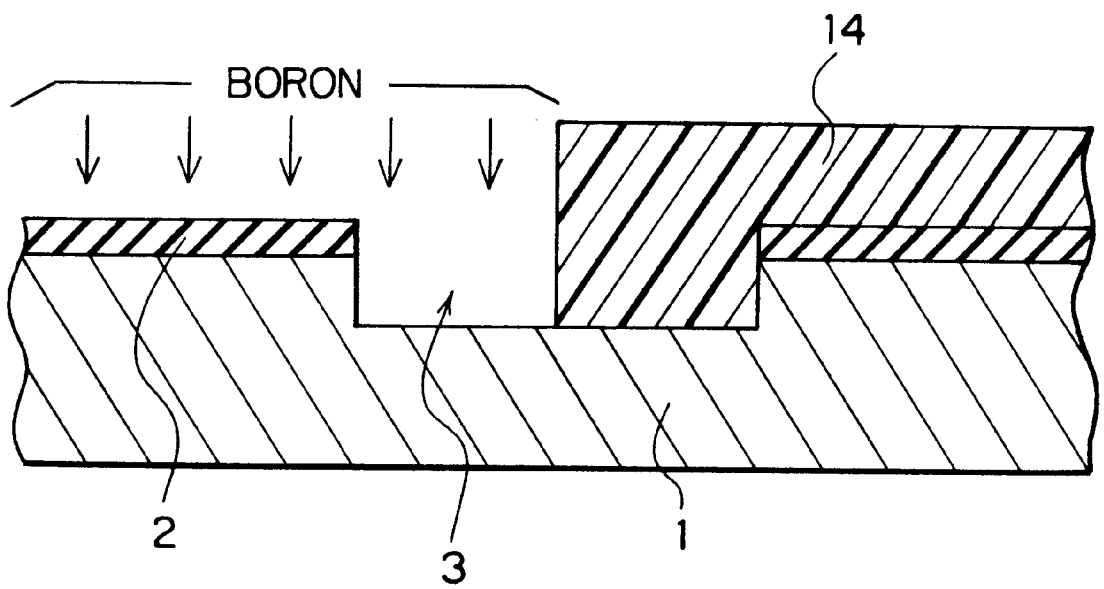
FIG. 6 is a sectional view showing an aspect of the middle step of the present invention.

Moreover, as shown in FIG. 6, it is also effective to selectively implant boron ions only into the p-well 7. In this case, as shown in FIG. 6, it is necessary to cover only the n-well 8 with photoresist 14 and implant boron ions after the step of forming the trench 3. However, if the separation width is too small in this step, boron cannot be diagonally implanted because it is shaded by the photoresist 14.

Figure 7A:
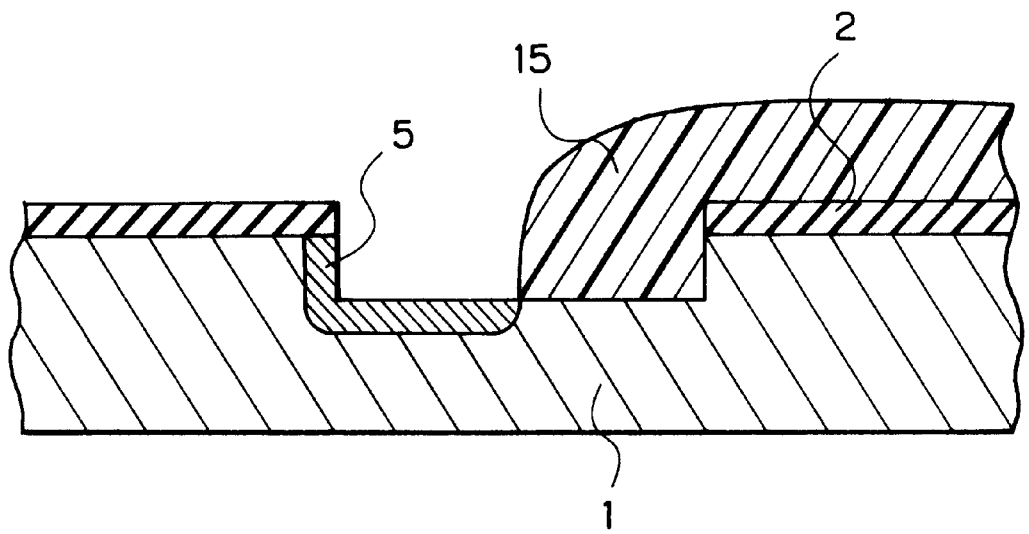
FIG. 7A is a sectional view showing the fourth embodiment of the present invention.
Figure 7B:
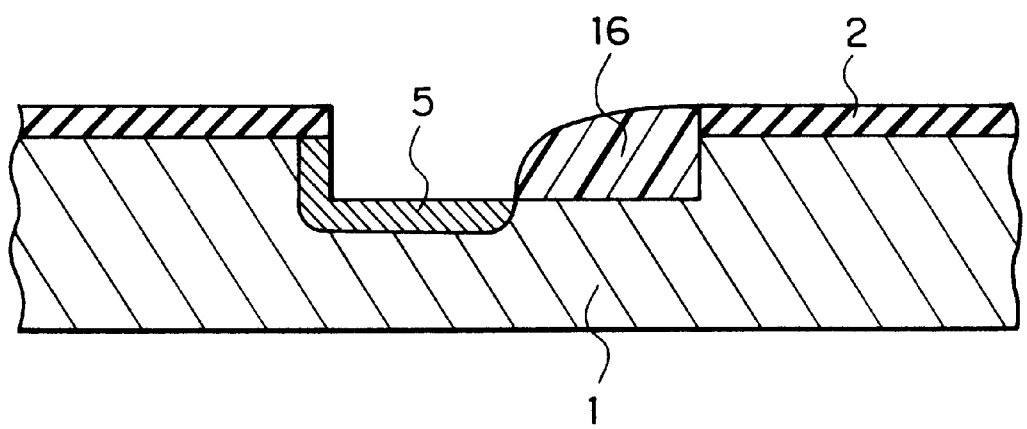
FIG. 7B is a sectional view showing the fifth embodiment of the present invention.

FIGS. 7A and 7B are views of the fourth and fifth embodiments showing the shapes of photoresists 15 and 16 used to avoid the problem caused in FIG. 6.

In FIG. 7A, the photoresist 15 whose shoulder is rounded is formed by forming the photoresist 14 in FIG. 6 and thereafter annealing it at a temperature at which it flows. As a result, the shaded area for ion implantation is decreased.

Moreover, in FIG. 7B, an advantage same as the above mentioned is obtained by forming the photoresist 14 in FIG. 6 and then, anisotropically etching it to form a side wall made of the photoresist 16 on the wall surface of the trench.

One of the problems is that the semiconductor substrate has an edge portion. To avoid such the problem, the method comprises a step of chamfering the edge portion before the above-described steps.

The above-described step is incorporated into other steps. As long as the above function is satisfied, it is free to replace preceding and following steps each other or perform simultaneous processing. Therefore, the above description does not restrict the present invention.

As described above, the present invention makes it possible to obtain an advantage that the inverse narrow channel effect of a semiconductor device using a trench isolation can be decreased.

This is because boron ions are implanted into the entire surface of a trench after the trench is formed and thereby, the amount of boron equivalent to a value of lowered concentration can be compensated by thermally outward diffusing the boron toward the silicon oxide for filling the trench.

The present invention is particularly effective for the inner narrow channel effect of an n-MOSFET. According to the embodiments, it is possible to reduce the standby current of a semiconductor integrated circuit by 30%.

What is claimed is:

1. A method of reducing the inverse narrow channel effect in a semiconductor device having a p-well, an n-well, and a trench isolation extending over said p-well and said n-well to separate respective source/drain regions formed in the p-well and n-well, said method comprising the steps of:

preparing a semiconductor substrate;

forming a trench for the trench isolation in the semiconductor substrate, said trench being defined by a plurality of side surfaces and a bottom surface extending between the side surfaces;

covering a region for said n-well with photoresist;

reflowing said photoresist to produce reflowed photoresist;

implanting boron ions into the semiconductor substrate through the side surfaces and bottom surface of the trench using an implantation direction that is diagonal to the semiconductor substrate;

filling the trench with an isolating material to form the trench isolation; and implanting ions into the semiconductor substrate to form the respective p-well and n-well at opposite sides of the trench isolation.

2. A method as claimed in claim 1, further comprising the step of implanting silicon into a region for said n-well prior to implanting ions to form the n-well.

3. A method as claimed in claim 1, wherein the step of implanting boron ions into the semiconductor substrate through the side surfaces and bottom surface of the trench comprises the steps of:

implanting a first type of ions selected from a group consisting of boron ions and phosphorus ions; and then implanting a second type of ions selected from said group.

4. A method as claimed in claim 1, wherein the step of implanting boron ions into the semiconductor substrate through the side surfaces and bottom surface of the trench comprises the steps of:

implanting a first type of ions selected from a group consisting of boron ions and arsenic ions; and then implanting a second type of ions selected from said group.

5. A method as claimed in claim 1, wherein the step of implanting boron ions into the semiconductor substrate through the side surfaces and bottom surface of the trench comprises the steps of:

implanting a first type of ions selected from a group consisting of boron ions, phosphorus ions, and arsenic ions; then implanting a second type of ions selected from said group; and then implanting a third type of ions selected from said group.

6. A method as claimed in claim 1, further comprising the step of selectively etching a part of said reflowed photoresist to leave part of said reflowed photoresist on side surfaces of the trench.

7. A method as claimed in claim 1, wherein said semiconductor substrate has an edge portion, said method further comprising the step of chamfering said edge portion before the forming step.

8. A method as claimed in claim 1, wherein said semiconductor substrate has a principal surface on which said trench is opened, said semiconductor substrate including a trench shoulder portion which is defined by said principal surface and each of said side surfaces of the trench, said method further comprising the step of rounding said trench shoulder portion before the step of implanting boron ions into the semiconductor substrate through the side surfaces and bottom surface of the trench.

9. A method as claimed in claim 1, wherein said semiconductor substrate is made of a first-conducting-type single-crystal silicon substrate.

10. A method of reducing the inverse narrow channel effect in a semiconductor device having a p-well, an n-well, and a trench isolation extending over said p-well and said n-well to separate respective source/drain regions formed in the p-well and n-well, said method comprising the steps of:

preparing a semiconductor substrate;

forming a trench for the trench isolation in the semiconductor substrate, said trench being defined by a plurality of side surfaces and a bottom surface extending between the side surfaces;

applying photoresist to cover a region for said n-well while leaving exposed a region for said p-well;

rounding shoulder portions of said photoresist by means of reflowing; and implanting boron ions into the semiconductor substrate through the side surfaces and bottom surface of the trench using said photoresist as a mask.

11. The method claimed in claim 10, wherein said reflowing is followed by anisitropic etching of said photo resist.

* * * * *